(12) United States Patent
Kadotani

(10) Patent No.: US 6,236,810 B1
(45) Date of Patent: May 22, 2001

(54) FLUID TEMPERATURE CONTROL DEVICE

(75) Inventor: Kanichi Kadotani, Kanagawa (JP)

(73) Assignee: Komatsu, Ltd., Tokyo (JP)

( * ) Notice: Subject to any disclaimer, the term of this patent is extended or adjusted under 35 U.S.C. 154(b) by 0 days.

(21) Appl. No.: 09/319,321

(22) PCT Filed: Dec. 3, 1997

(86) PCT No.: PCT/JP97/04421

§ 371 Date: Jun. 3, 1999

§ 102(e) Date: Jun. 3, 1999

(87) PCT Pub. No.: WO98/25089

PCT Pub. Date: Jun. 11, 1998

(30) Foreign Application Priority Data

Dec. 3, 1996 (JP) ................................ 8-338965
Feb. 25, 1997 (JP) ................................ 9-056934

(51) Int. Cl.$^7$ ........................................... F24H 1/10
(52) U.S. Cl. ........................ 392/485; 392/483; 392/488
(58) Field of Search .......................... 392/479, 480, 392/481, 485, 487, 488, 489, 483, 478, 496

(56) References Cited

U.S. PATENT DOCUMENTS

| | | | |
|---|---|---|---|
| 3,108,174 | * 10/1963 | Hynes | 392/485 |
| 3,334,400 | * 8/1967 | Jaeger | 392/485 |
| 3,777,117 | * 12/1973 | Othmer | 392/478 |
| 4,083,478 | * 4/1978 | McLane | 392/485 |
| 4,514,617 | * 4/1985 | Amit | 392/385 |
| 4,577,093 | * 3/1986 | Plard et al. | 392/485 |
| 5,400,432 | * 3/1995 | Kager et al. | 392/485 |
| 5,790,752 | * 8/1998 | Anglin et al. | 392/483 |
| 5,995,711 | * 11/1999 | Fukuoka et al. | 392/485 |
| 6,055,360 | * 4/2000 | Inoue et al. | 392/485 |
| 6,091,890 | * 7/2000 | Gruzdev et al. | 392/485 |

FOREIGN PATENT DOCUMENTS

| | | |
|---|---|---|
| 3927947 | 9/1939 | (JP) . |
| 407407 | 3/1940 | (JP) . |
| 416363 | 3/1941 | (JP) . |
| 5132454 | 8/1949 | (JP) . |
| 320273 | 2/1991 | (JP) . |
| 579695 | 3/1993 | (JP) . |
| 547763 | 6/1993 | (JP) . |
| 590175 | 12/1993 | (JP) . |
| 06159955 | 6/1994 | (JP) . |
| 07202275 | 8/1995 | (JP) . |
| 07280470 | 10/1995 | (JP) . |
| 7310957 | 11/1995 | (JP) . |

* cited by examiner

Primary Examiner—Teresa Walberg
Assistant Examiner—Fadi H. Dahbour
(74) Attorney, Agent, or Firm—Gallagher & Lathrop; David N. Lathrop

(57) ABSTRACT

A fluid temperature control device, which has a high cooling capacity, wide controllable temperature range and an excellent temperature control accuracy. A transparent cylinder (3) is inserted in a cylindrical-shaped vessel (1), and a columnar-shaped heating lamp (5) is inserted in the transparent cylinder (3). A fluid desired to be temperature controlled is made to flow in a passage (25) between the vessel (1) and the transparent cylinder (3). Joined to an outer peripheral al surface of the vessel (1) is a thermoelectric conversion element (7), to an outer surface of which is joined a cooling pipe (9). A cooling liquid is made to flow in the cooling pipe (9). Fluid heating is effected by the heating lamp (5). Fluid cooling is effected by the cooling liquid and the thermoelectric conversion element (7) forcibly absorbs heat from the fluid and discharges heat to the cooling liquid to thereby cool the fluid rapidly and cool the fluid to a temperature lower than that of the cooling liquid. Further, the thermoelectric conversion element (7) is used to suppress cooling by the cooling liquid and control an amount of cooling with good accuracy and good responsiveness.

22 Claims, 15 Drawing Sheets

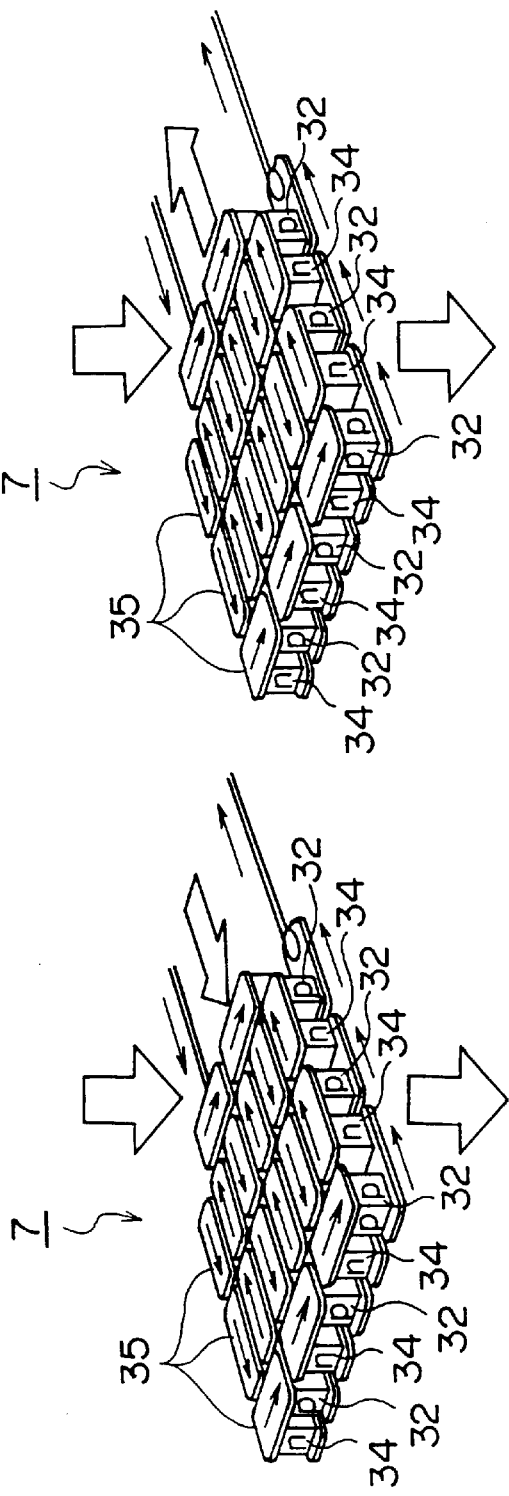

FLUID TEMPERATURE CONTROL DEVICE

TECHNICAL FIELD

The present invention relates to a fluid temperature control device, and more particularly to an improved construction for cooling a fluid.

BACKGROUND ART

A circulating fluid is often used to control the temperature of a processing chamber or walls of a device, such as an constant-temperature tank, semiconductor manufacturing device (etching device or CVD device for example), or plastic plate thermocompression molder. In Japanese Patent Laid-open No. 7-280470 and Japanese Patent Laid-open No. 7-308592 are disclosed devices suitable for controlling the temperature of a circulating fluid.

The device disclosed in Japanese Patent Laid-open No. 7-280470 has an electric heater inserted into a pipe in which is flowing a fluid; covering the outside surface of this pipe is an even larger pipe, and cooling water is made to flow between the outside pipe and inside pipe. The electric heater and the cooling water are used to control the temperature of the fluid.

The device disclosed in Japanese Patent Laid-open No. 7-308592 has a radiator joined via a thermoelectric conversion element to a heat transfer block, on the inside of which is made to flow a fluid. The fluid flowing in the block is cooled or heated by the thermoelectric conversion element. The heat absorbed by the thermoelectric conversion element from the fluid is discharged to the atmosphere by a radiator.

The above-mentioned conventional fluid temperature control devices have the following disadvantages, in particular as relates to cooling performance.

The device in Japanese Patent Laid-open No. 7-280470 cannot cool the fluid below the temperature of the cooling liquid, which means it has a narrow cooling temperature range. Further, in general, it is difficult to make fine adjustments to the cooling liquid temperature or flow volume, so if the fluid temperature is not finely adjusted by also using a heater during cooling, then the fluid cannot be cooled to the target temperature with good accuracy.

The device of Japanese Patent Laid-open No. 7-308592 discharges heat to the atmosphere from a thermoelectric conversion element during cooling, but the low heat capacity of the atmosphere causes the cooling capacity to be low, which means it is difficult to process a large quantity of fluid in a short time. Further, because the thermoelectric conversion element is used for both heating and cooling, the controllable temperature range is not very wide and the life of the thermoelectric conversion element is shortened.

DISCLOSURE OF THE INVENTION

An object of the present invention is to provide a fluid temperature control device with high cooling capacity, wide controllable temperature range, and excellent temperature control accuracy.

An additional object of the present invention is to provide a fluid temperature control device with simple cooling amount control.

In accordance with a first aspect of the present invention, the fluid temperature control device comprises a fluid passage in which flows a fluid, a cooling liquid passage in which flows a cooling liquid, and thermoelectric conversion elements situated between the fluid passage and the cooling liquid passage so as to allow heat to be absorbed from the fluid and heat to be discharged to the cooling liquid.

By placing the thermoelectric conversion elements between the fluid passage and the cooling liquid passage to effect absorption of heat from the fluid and discharge of heat to the cooling liquid, the fluid temperature control device affords larger cooling capacity than conventional devices, which performs cooling by means of the cooling liquid alone or discharge heat from the thermoelectric conversion elements to the atmosphere, and allows the fluid to be cooled to a temperature below the temperature of the cooling liquid. Further, the thermoelectric conversion elements not only increase the amount of cooling but can also act to suppress the amount of cooling by the cooling liquid to allow fine control of the amount of cooling, which is difficult to achieve using just a cooling liquid.

It is desirable that the fluid temperature control device further comprise a heater that is placed in the proximity of the fluid passage. It is desirable that the heater be a lamp that emits infrared light. This makes it possible to effect heating and cooling of the fluid over a wide temperature range.

In a preferred embodiment, there is a cylindrical vessel and along the outside surface of this vessel are placed thermoelectric conversion elements. A transparent cylinder is inserted into the vessel, and the space between the outside surface of the transparent cylinder and the inside surface of the vessel forms the fluid passage. Into the transparent cylinder is inserted an infrared light emitting lamp that acts as a heater. The thermoelectric conversion elements can be joined to the outside surface of the vessel or can be embedded in the wall of the vessel. The thermoelectric conversion elements are placed over substantially the entire outside surface area of the vessel. On the exterior of the thermoelectric conversion elements is placed a cooling liquid passage. The cooling liquid passage can be formed by joining to the thermoelectric conversion elements the tubes in which flows the cooling liquid, or by fitting a larger diameter outer cylinder about the exterior of the vessel so that the space between the inside surface of the outer cylinder and the outside surface of the vessel or the outside surfaces of the thermoelectric conversion elements forms a cooling liquid passage. Further, a large number of fins are placed in the fluid passage and the cooling liquid passage.

Water or refrigerant from a refrigeration circuit can be used as the cooling liquid in the cooling liquid passage of the fluid temperature control device of the present invention. Alternatively, anti-freeze can be cooled by a refrigeration circuit and then made to flow in the cooling liquid passage.

In accordance with a second aspect of the present invention, the fluid temperature control device comprises a cylindrical vessel having a fluid passage along its inner surface and thermoelectric conversion elements placed on the wall of the vessel for absorbing heat from the fluid.

Because the fluid temperature control device allows the thermoelectric conversion elements to be placed on the wall of the cylindrical vessel so as to surround the fluid passage, a cooling capacity that is high given the size of the device can be achieved, as can a wide cooling temperature range. Further, by allowing the amount of cooling to be controlled by the thermoelectric conversion elements while also allowing nearly uniform cooling of the fluid in the fluid passage, there is provided high accuracy of temperature control.

It is desirable that the fluid temperature control device further comprise a cooling liquid passage placed in proximity to the thermoelectric conversion element in order to absorb the heat discharged from the thermoelectric conversion element. This significantly increases the cooling capacity. Further, it is desirable that the fluid temperature control device further comprise a heater, situated in proximity to the fluid passage, for heating the fluid.

If the wall of the cylindrical vessel is sufficiently thick, a plurality of holes or hollows can be placed in the wall. This will reduce the volume of the cylinder, making it lighter, and will reduce the heat capacity of the cylinder, improving the thermal response of the device. It is desirable that the shape and position of the holes or hollows be selected such that the areas of the cylinder wall without holes or hollows will extend continuously along a heat transmission path from the vessel interior side fluid passage to the thermoelectric conversion elements. This will allow almost no degradation of the vessel's heat transmission even when there are holes or hollows in the vessel.

Other objects and features of the present invention will become apparent through the following description of the embodiments.

BRIEF DESCRIPTION OF THE DRAWINGS

FIG. 4 shows perspective views of the thermoelectric conversion element;

BEST MODE FOR CARRYING OUT THE INVENTION

The preferred embodiments of the present invention will now be described with reference to the accompanying drawings.

Figure 1:
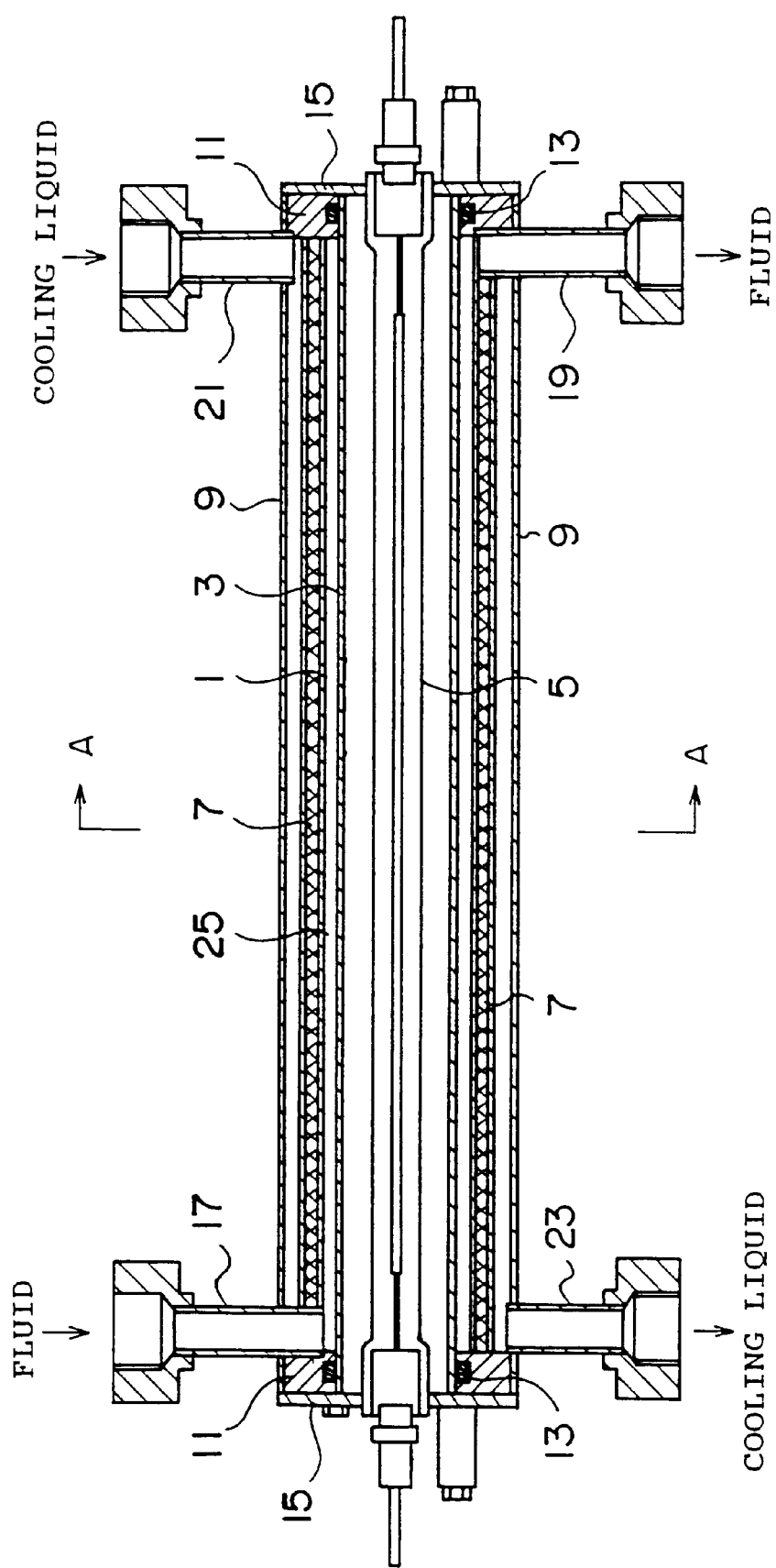
FIG. 1 is a longitudinal sectional view of a fluid temperature control device pertaining to a first embodiment of the present invention.
Figure 2:
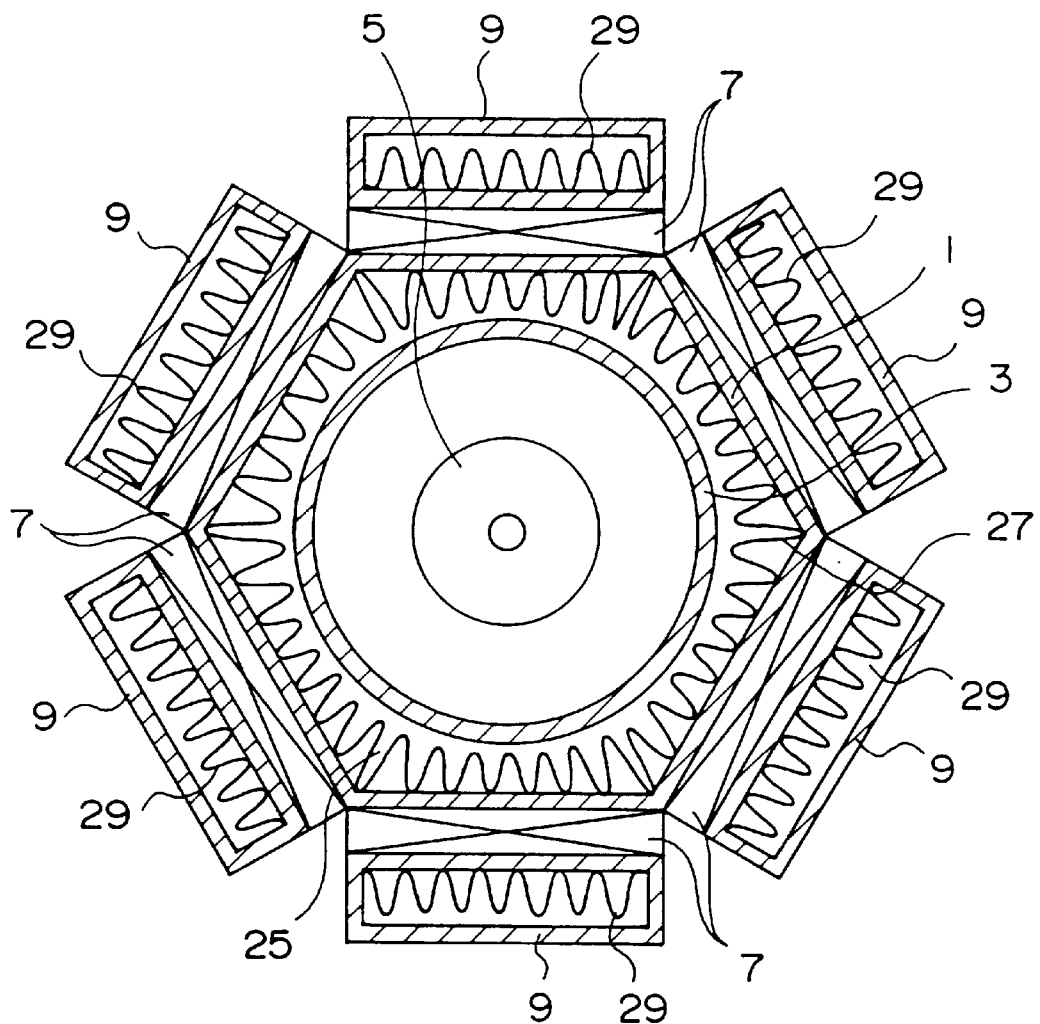
FIG. 2 is a cross-section arrow view drawing at line A—A shown in FIG. 1.

FIG. 1 is a longitudinal sectional view of a fluid temperature control device pertaining to an embodiment of the present invention; FIG. 2 is a transverse sectional view of the device seen along line A—A.

A round cylindrical transparent cylinder 3 is inserted into a vessel 1 having a polygonal cylindrical shape, such as a hexagonal cylindrical shape, and is positioned concentrically to the axis of the vessel, and a rod-shaped heating lamp 5 is inserted into the transparent cylinder 3 and positioned concentrically to the axis of the transparent cylinder, as shown in FIGS. 1 and 2. Six long, flat thermoelectric conversion elements 7, 7, . . . are joined to the six flat sides that constitute the outer surface of the vessel 1. Further, cooling pipes 9, 9, . . . , which are shaped as rectangular cylinders, are joined to the outside surfaces of the six thermoelectric conversion elements 7, 7, . . . . The shape of the vessel 1 is not limited to a hexagonal cylinder, but can be a square cylinder or some other polygonal cylinder.

Doughnut-shaped bushings 11, 11 are fitted about the exteriors of the portions of both ends of the transparent cylinder 3 that protrude outwardly at both ends of the vessel 1, and these bushings 11, 11 seal both ends of the vessel 1 and a cooling tube 9. The joints between the bushings 11, 11 and the transparent cylinder 3 are sealed by O-rings 13, 13. On the outside of each bushing 11, 1 is placed a disc-shaped bushing 15, 15 that has a circular hole in the center, these bushings being held in place by screws. The outer bushings 15, 15 hold the inner bushings 11, 11 and the transparent cylinder 3 by holding them from both ends while supporting both ends of the heating lamp 5.

In the proximity of the two ends of the vessel 1 are respectively located a fluid inlet 17 that causes the fluid to flow into the vessel 1 and a fluid outlet 19 that causes the fluid to flow out of the vessel 1. Further, the cooling pipes 9, 9, . . . are linked together in the proximity of both ends, and in the place where both ends are linked are located a cooling liquid inlet 21 for causing the cooling liquid to flow into the cooling pipes 9, 9, . . . , and a cooling liquid outlet 23 for discharging the cooling liquid from cooling pipes 9, 9, . . . . Separate cooling liquid inlets and outlets can be provided for each of the cooling pipes 9. The fluid that has flowed into the vessel 1 flows in the passage (hereafter "fluid passage") 25 between the vessel 1 and the transparent cylinder 3 from one end of the vessel 1 to its other end. Further, the cooling liquid flows in each cooling pipe 9 in the opposite direction of the fluid.

On the inside surface of the vessel 1 are provided a large number of fins 27 (omitted from the drawing in FIG. 1). The fins 27 are distributed at nearly the same density throughout the entire area of fluid passage 25. A small gap is left between the distal ends of the fins 27 and the transparent cylinder 3, and therefore the fins 27 and the transparent cylinder 3 do not make contact. A large number of fins 29 are also provided on the interior of the wall of each cooling tube 9 joined to the thermoelectric conversion elements 7 (omitted from the drawing in FIG. 1). The fins 29 are distributed at nearly the same density throughout the entire area inside the cooling tube 9. A small gap is left between the distal ends of the fins 29 and the wall on the opposite side of the cooling tube 9, therefore, the distal ends of the fins and the tube wall do not make contact.

It is desirable that the vessel 1 be made from a material with good thermal conductivity, good corrosion resistance, and good moldabilty, such as aluminum, copper, or stainless steel. For the cooling tube 9, it is desirable that at least the wall thereof which is joined to the thermoelectric conversion element 7 be made from a material with thermal conductivity that is as good as that used for the vessel 1, but the other walls can be made from a material that does not have high thermal conductivity but that does have good corrosion resistance and good moldability, such as plastic, vinyl chloride, or ceramics. It is desirable that the transparent cylinder 3 be made from a heat resistant material with very high light transmission, such as quartz glass. It is desirable that the heating lamp 5 be a type that emits much infrared light, such as a halogen lamp for heating applications. It is desirable that the bushings 11, 15 be made from a material with suitable elasticity and sufficient heat resistance, such as hard rubber, plastic, or metal. For the joined surfaces of the vessel 1 and each thermoelectric conversion element 7, and the joined surfaces of each thermoelectric conversion element 7 and each cooling pipe 9, it is desirable that a tight contact be achieved by tightening with screws after applying a packing having high heat conductivity, such as silicon grease, to obtain complete adhesion between both surfaces to minimize the contact heat resistance.

Figure 3A:
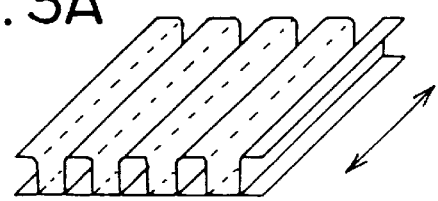
FIG. 3 shows perspective views of fin shape variations.
Figure 3E:
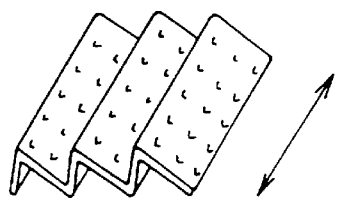
Figure 3B:
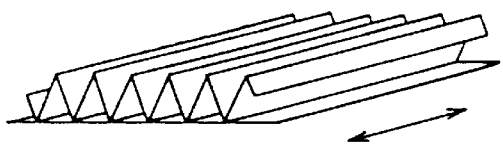
Figure 3F:
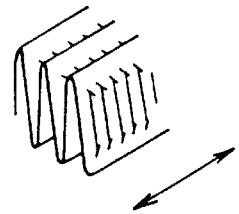
Figure 3C:
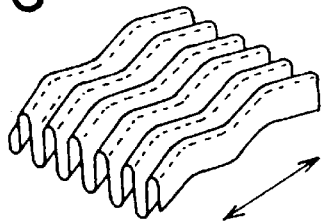
Figure 3G:
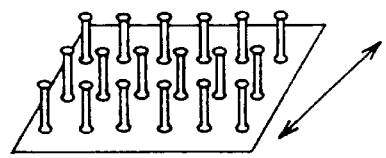
Figure 3D:
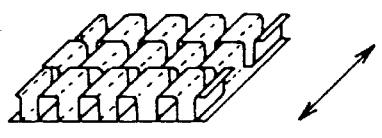
Figure 3H:
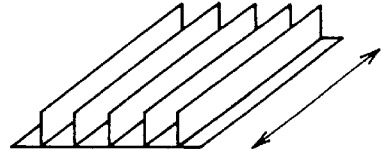

The fins 27, 29 are made from a material with high heat conductivity, good corrosion resistance, and good moldability, such as aluminum, copper, or stainless steel. Further, it is desirable that this material also have good infrared light absorptivity. A variety of shapes can be used for the fins 27, 29, such as those shown in FIGS. 3A through 3H. FIG. 3A shows a thin sheet bent in a cross-sectional square wave form, FIG. 3B shows a thin sheet bent in a cross-sectional triangular wave form, FIG. 3C shows a thin sheet bent in a cross-sectional wave shape that has also been formed into a wave pattern along the ridges, and FIG. 3D shows a plurality of belt-shaped thin sheets that have been bent into a wave form and that have been placed with the wave positions being mutually offset. FIG. 3E shows a wave-shaped thin sheet with the surface covered with many indentations or protrusions, and FIG. 3F shows a wave-shaped thin sheet with the surface covered with many louver-like slits. Further, FIG. 3G shows pin-like fins, and FIG. 3H shows simple plate-shaped fins.

The arrows in FIG. 3 indicate the direction of flow (nearly parallel to the center axis on the interior of the vessel 1) of the fluid or cooling liquid in relation to the fins when the fluid or cooling liquid pressure loss due to the fins is minimized. It is desirable that the fins be inclined at an angle that is more suitable for the arrow flow direction than the fin attitude shown in the drawing in order to assure good exchange of heat between the fins and the cooling liquid or fluid.

Further, in particular for the fins 27 in the vessel 1, it is desirable that the fins 27 be oriented as follows: When using a substance with a high light absorptivity, such as water or ethylene glycol, as the fluid, it is desirable that the fins 27 are stood parallel to the direction of infrared light radiation, or, in other words, that they are stood radially in the vessel 1, so that the infrared light from the heating lamp 5 crosses the entire area of the fluid passage 25 and is evenly absorbed throughout the entire area of the fluid. However, when a substance with a low light absorptivity, such as GALDEN (registered trademark) or FLUORINERT (registered trademark), is used for the fluid, it is desirable that the fins 27 be stood so as to intersect the direction of infrared light radiation at an appropriate angle so that the infrared light is uniformly absorbed by all parts of the fins 27.

FIG. 4 shows the construction of the thermoelectric conversion element 7.

The thermoelectric conversion element 7 has numerous small p-type semiconductor pieces 32 and n-type semiconductor pieces 34 arranged alternately in a two-dimensional plane, while at the same time numerous flat sheet electrodes 35 provided on top of and below the p-type semiconductor pieces 32 and n-type semiconductor pieces 34 are used to create a serial electrical connection with the p-type semiconductor pieces 32 and n-type semiconductor pieces 34 arranged in alternating order. When direct current electricity is supplied to the thermoelectric conversion element 7, a Peltier effect is created, causing the thermoelectric conversion element 7 to absorb heat on one side thereof and to discharge heat at the other side, as shown in FIG. 4A. This operation mode is hereafter called the "Peltier mode." Further, the faces of the thermoelectric conversion element 7 that absorb and discharge heat are hereinafter called the "heat exchange faces." When one of the heat exchange faces of the thermoelectric conversion element 7 is heated and the other heat exchange face is cooled, a Seebeck effect is created, and this causes the thermoelectric conversion element 7 to generate electricity, as shown in FIG. 4B. This operation mode is hereinafter called the "Seebeck mode." Each of the heat exchange face of the thermoelectric conversion element 7 is generally covered with an insulating plate (omitted from the drawing), such as a ceramic plate. As was previously explained, one heat exchange face of each thermoelectric conversion element 7 is joined to the vessel 1 and the other heat exchange face is joined to a cooling pipe 9. Each thermoelectric conversion element 7 is connected to a power supply circuit (cooling controller) that is not shown in the drawing.

The above arrangement causes the fluid to be 1 temperature controlled to flow into the vessel 1 via the inlet 17, through fluid passage 25, and out of outlet 19. Further, the cooling liquid is made to flow into each cooling tube 9 from the inlet 21, through cooling tubes 9, and out of the outlet 23.

If the target temperature (100° C. for example) is higher than the fluid temperature (25° C. for example) at the inlet 17, then the lamp 5 turns on. In this case, as a rule, the cooling liquid flow will be stopped and the thermoelectric conversion element 7 will also stop operating. The fluid will be heated by the lamp 5 exclusively. The infrared light emitted by the lamp 5 passes through the transparent cylinder 3 and enters the fluid passage 25. If a substance with a very low light absorptivity (FLUORINERT for example) is used as the fluid, most of the infrared light will be absorbed by the fins 27, with the heat then being transmitted from the fins 27 to the fluid. If a substance with a high degree of light absorptivity (water or ethylene glycol, for example) is used as the fluid, the infrared light will be absorbed not only by the fins 27 but also directly by the fluid, thus heating the fluid.

The amount of heating is controlled using a temperature sensor (not shown in the drawing) placed at the outlet 19 and a heating controller (not shown in the drawing) that is connected to the temperature sensor and to the lamp 5 for adjusting the duty ratio during the time that the lamp 5 is on and the amount of light emitted. For example, the heating controller controls the supply of electricity to the lamp 5 based on the deviation between fluid outlet temperature feedback from the temperature sensor and the target temperature. If the outlet temperature of the fluid exceeds the target temperature due to overheating or an external factor, the lamp 5 will be turned off. Further, if just turning off the lamp is insufficient, the cooling liquid will be made to flow and, if necessary, the thermoelectric conversion elements 7 will be operated.

Further, if the target temperature (30° C. for example) is below the inlet temperature of the fluid (80° C. for example), the cooling liquid will be made to flow and the lamp 5 will normally be turned off. The heat from the fluid will be transmitted to the cooling liquid via the fins 27, vessel 1, thermoelectric conversion elements 7, cooling tubes 9, and fins 29 to cool the fluid. To rapidly cool the fluid (when the inlet temperature of the fluid has risen rapidly, for example) or to cool it below the temperature of the cooling liquid (when the target temperature is 0° C. for example), the thermoelectric conversion elements 7 are operated in the Peltier mode to forcibly remove heat from the fluid and discharge it to the cooling liquid. Further, to suppress cooling by the cooling liquid (when cooling by the cooling liquid has cooled the fluid to below the target temperature, for example), the thermoelectric conversion elements 7 are operated in the Seebeck mode to convert to electricity a portion of the heat transferred from the fluid to the cooling liquid. Using the power supply circuit to adjust the current flowing in the thermoelectric conversion elements 7 in both Peltier mode and Seebeck mode allows the amount of cooling to be finely controlled with good responsiveness.

As will be apparent from the foregoing description of operation, heating is effected solely by the heat emitted from the lamp 5. The discharged heat reaches uniformly to all areas of the fluid passage 25 that can be reached by light. This results, when the fluid is a substance that absorbs light, in the fluid evenly receiving the discharged heat in all areas of the fluid passage 25, raising the temperature of the fluid in a substantially uniform manner. Further, when the fluid is a substance that absorbs nearly no light, the large number of fins 27 that exist at a nearly uniform density throughout the entire area of the fluid passage 25 evenly absorb the discharged heat and transmit it to the fluid to nearly uniformly raise the temperature of the fluid.

Most of the output from the lamp 5 is radiated as infrared light nearly uniformly throughout the entire area of the fluid passage 25. Further, there is empty space between the lamp 5 and the transparent cylinder 3. For this reason, there is no danger that heat transmitted from the lamp 5 will heat the transparent cylinder 3 to an especially high temperature, causing it to melt, or the fluid passing in proximity thereto to boil. This allows a lamp 5 with a high output to be used, which in turn allows a high heating performance to be obtained with a relatively small device.

Cooling is conducted utilizing heat conduction and convective heat transfer from the fluid in the vessel 1 to the cooling liquid in the cooling pipes 9 via the fins 27, the thermoelectric conversion elements 7, and the fins 29. Because the fins 27, 29 are positioned with nearly uniform density throughout the entire area of the fluid passage 25 and cooling pipes 9, good cooling efficiency and little cooling temperature non-uniformity are achieved. Further, the thermoelectric conversion elements 7 increase the amount of cooling, expand the cooling temperature range, and make easy control of the amount of cooling with high accuracy and good responsiveness, which is difficult to do with cooling liquid. Further, energy can be conserved because when in the Seebeck mode the thermoelectric conversion elements 7 convert heat from the fluid into electricity and return it to the power supply circuit. Using the thermoelectric conversion elements 7 to control the amount of cooling eliminates the need to use an expensive proportional valve in order to adjust the flow rate of the cooling water, so only an inexpensive gate valve to start and stop the cooling water flow is required. For the same reason, there is no need to turn on the lamp during cooling in order to prevent overcooling. Further, because the thermoelectric conversion elements 7 are used exclusively for cooling the fluid and not for heating it, the life of the thermoelectric conversion elements 7 will be longer than they would if they were used for both cooling and heating.

The provision of a gap between the fins 29 inside the cooling pipes 9 and the exterior wall of cooling pipes 9 has an advantage in that it makes the arrangement resistant to being affected by the external temperature. Further, the gap between the fins 27 situated in the fluid passage 25 and the transparent cylinder 3 has an advantage in that it makes it easy to insert and remove the transparent cylinder 3 in and from the vessel 1 when assembling and maintaining the device.

Figure 5:
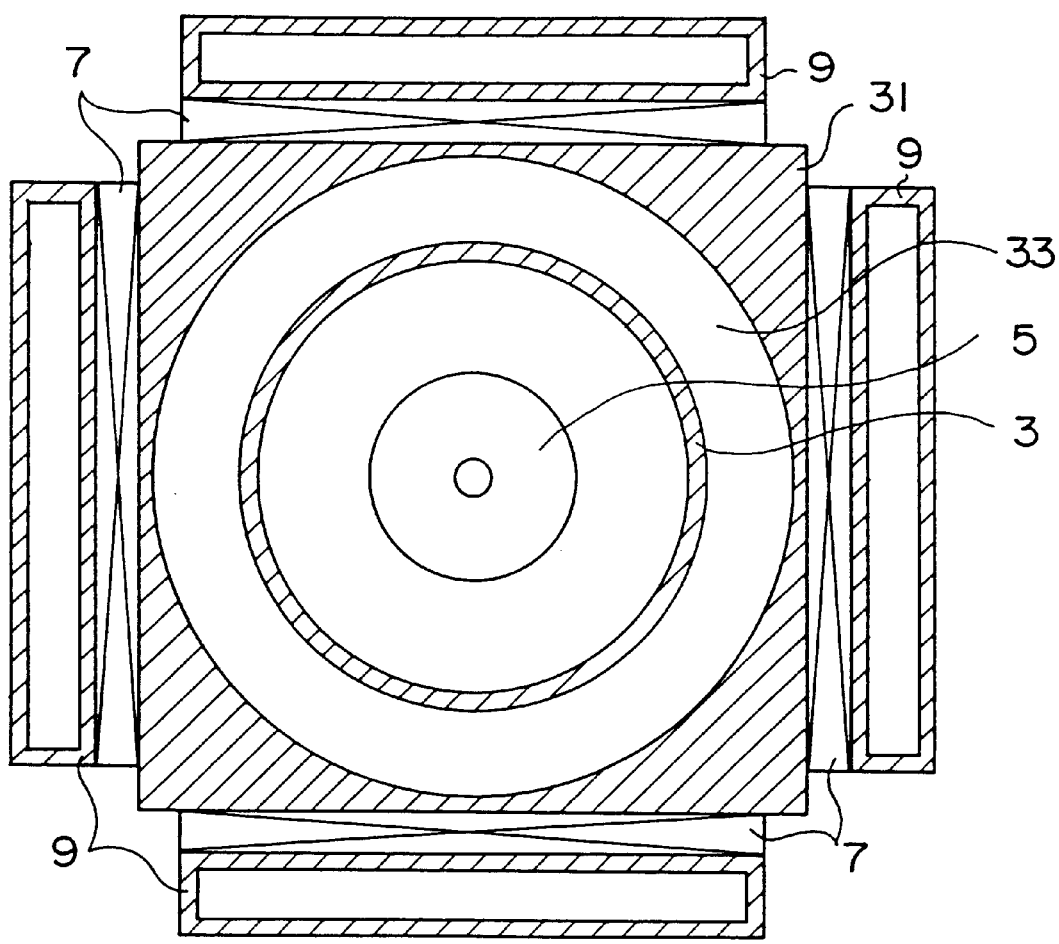
FIG. 5 is a transverse sectional view of a fluid temperature control device pertaining to a second embodiment of the present invention.

FIG. 5 shows a transverse sectional view of a fluid temperature control device pertaining to a second embodiment of the present invention.

The vessel 31 is a cylinder having an interior wall that is round when viewed in transverse section and an exterior wall that is square when viewed in transverse section, as shown in FIG. 5, and can be manufactured by extrusion molding of a metal, for example. The exterior circumference of the vessel 31 has four flat sides to which the respective thermoelectric conversion elements 7 are joined. The arrangement of other parts is the same as the embodiment shown in FIGS. 1 and 2. The fins in the fluid passage 33 and cooling pipes 9 have been omitted from the drawing to make it easier to read the drawing. Due to the perfectly circular cylindrical shape of the fluid passage 33, it is expected that this embodiment will provide even less fluid temperature non-uniformity than the previous embodiment. The external cross-sectional shape of the vessel 31 is not limited to a square, but can be another polygonal shape.

Figure 6:
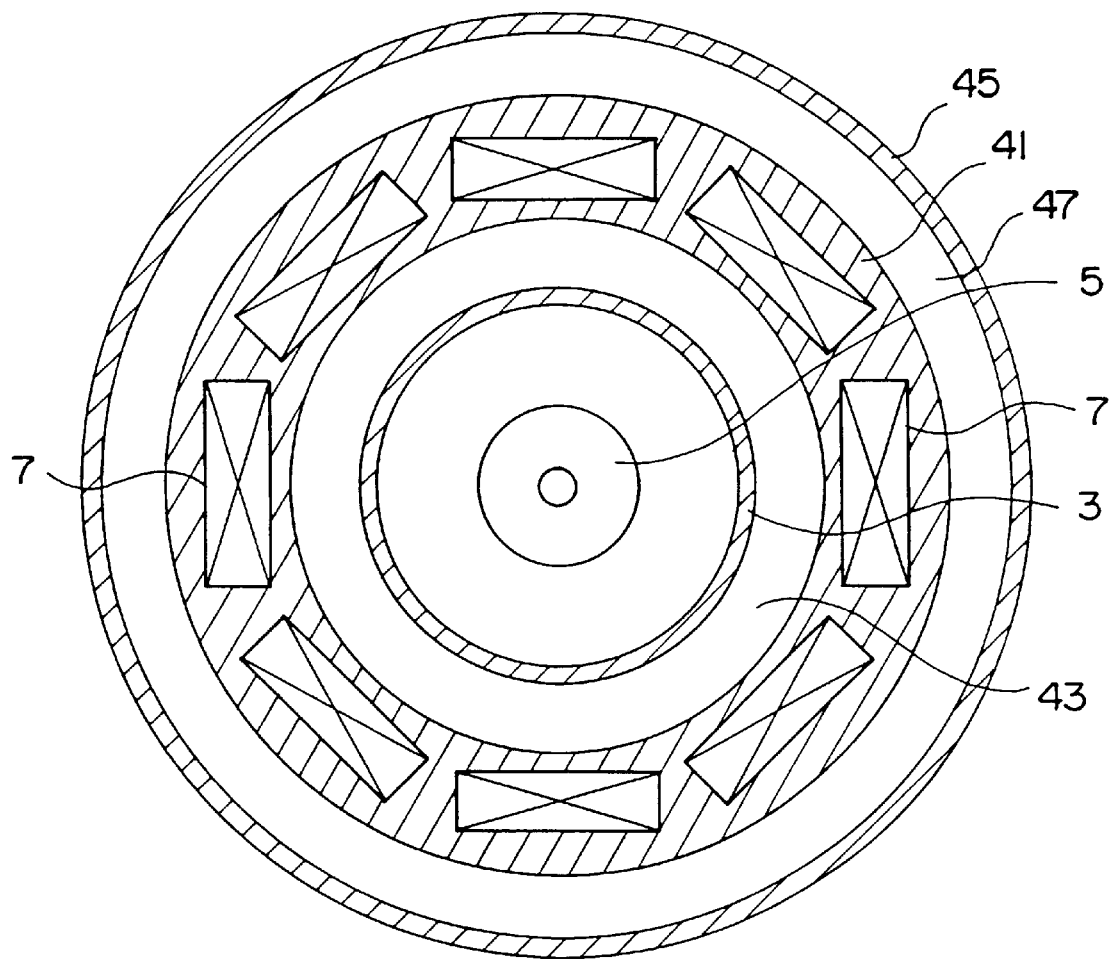
FIG. 6 is a transverse sectional view of a fluid temperature control device pertaining to a third embodiment of the present invention.

FIG. 6 shows a transverse sectional view of a fluid temperature control device pertaining to a third embodiment of the present invention.

The vessel 41 is a round cylinder with a thick wall that has a plurality of thermoelectric conversion elements embedded in the wall around the entire circumference of the vessel, as shown in FIG. 6. The exterior of the vessel 41 is enclosed by an outer cylinder 45 that has a larger diameter, and between the outer cylinder 45 and the vessel 41 is a cooling water passage 47 through which flows the cooling water. A large number of fins (omitted from the drawing) are placed on the inside and outside surfaces of the vessel 41, and these fins are distributed at nearly uniform density throughout the entire area of the fluid passage 43 and the cooling liquid passage 47. The arrangement of other parts is the same as the embodiment shown in FIGS. 1 and 2. It is desirable that the gaps between adjacent thermoelectric conversion elements 7 be not made of the same material as the wall of the vessel 41, as shown in the drawing, but rather be filled with a material that has very poor heat conductivity (not shown in the drawing).

Figure 7:
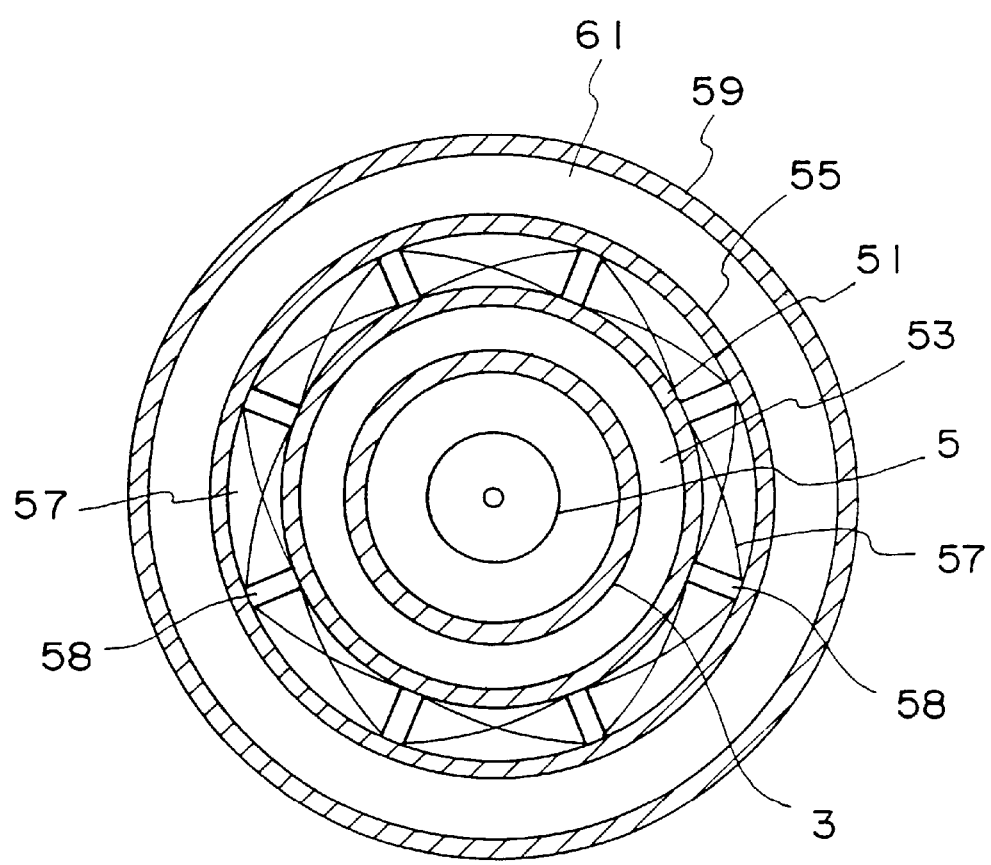
FIG. 7 is a transverse sectional view of a fluid temperature control device pertaining to a fourth embodiment of the present invention.

FIG. 7 shows a transverse sectional view of a fluid temperature control device pertaining to a fourth embodiment of the present invention.

To the outside surface of a round cylindrical vessel 51 are joined a plurality of curved thermoelectric conversion elements 57 that are closely spaced around the entire circumference of the vessel, as shown in FIG. 7. The exterior of the vessel 51 is enclosed by a round intermediate cylinder 55, and between the intermediate cylinder 55 and the vessel 51 are placed thermoelectric conversion elements 57, which are closely held between the intermediate cylinder 55 and the vessel 51. The exterior of the intermediate cylinder 55 is enclosed by a round outer cylinder 59, and between the outer cylinder 59 and the intermediate cylinder 55 is a cooling water passage 61. It is desirable that the gaps 58 between adjacent thermoelectric conversion elements 57 be filled with a layer of air or a material that has very poor heat conductivity. The arrangement of the other parts is the same as in the embodiment shown in FIG. 6. The fins in the fluid passage 53 and in the cooling water passage 61 are omitted from the drawing.

Figure 8:
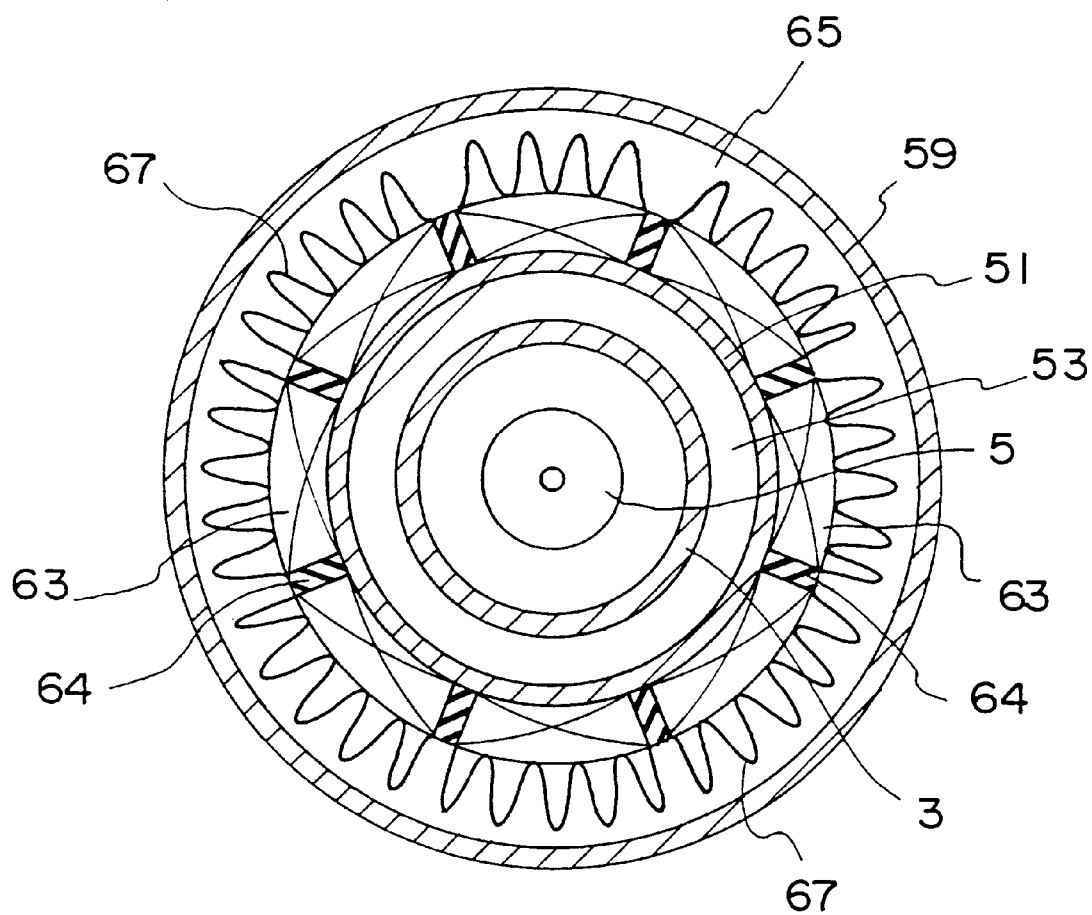
FIG. 8 is a transverse sectional view of a fluid temperature control device pertaining to a fifth embodiment of the present invention.

FIG. 8 shows a transverse sectional view of a fluid temperature control device pertaining to a fifth embodiment of the present invention.

To the outside surface of a round cylindrical vessel 51 are joined a plurality of curved thermoelectric conversion elements 63, and the exterior of this arrangement is enclosed by an outer cylinder 59, a cooling liquid passage 65 being formed between the outer cylinder 59 and the thermoelectric conversion elements 63, as shown in FIG. 8. The exterior faces of the thermoelectric conversion elements 63, especially the side faces, are sealed with a suitable sealant 64 so that cooling liquid does not seep into the elements. Further, the heat exchange faces of the thermoelectric conversion elements 63 facing the cooling liquid passage 65 are provided with fins 67. The thermoelectric conversion elements 63 and the fins 67 can be formed as a single unit. The other parts of the arrangement are the same as the embodiment shown in FIG. 7. The fins in the fluid passage 53 are omitted from the drawing.

Figure 9A:
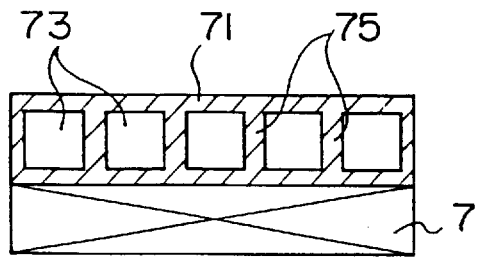
FIG. 9 shows transverse sectional views of several cooling tube variations.
Figure 9B:
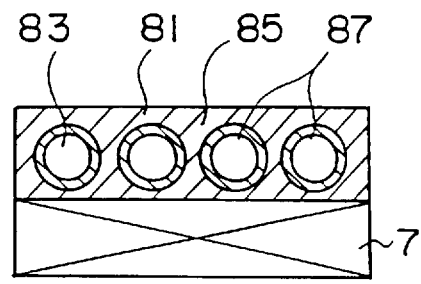
Figure 9C:
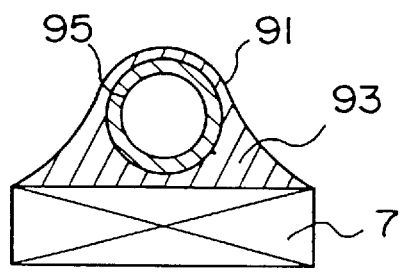

FIGS. 9A to 9C show transverse sections of several cooling pipe variations.

The cooling pipe 71 shown in FIG. 9A can be extrusion molded, for example, in such a way that a plurality of cooling liquid passages 73 are formed on the inside of the cooling tube 71, and is joined the heat exchange face of a thermoelectric element 7. Dividers 75 between the cooling liquid passages 73 act as fins, so there is no particular need to provide fins. The cooling pipe 81 shown in FIG. 9B has a plurality of interior cooling liquid passages 83 that are formed, for example, by casting copper pipes 83 in an aluminum block 85, and joining the element to the heat exchange face of a thermoelectric conversion element 7. This arrangement also does not require that fins be provided. The cooling tube 91 shown in FIG. 9C is formed, for example, by casting a single copper pipe 93 in an aluminum block 95, and joining the element to the heat exchange face of a thermoelectric conversion element 7.

Figure 10:
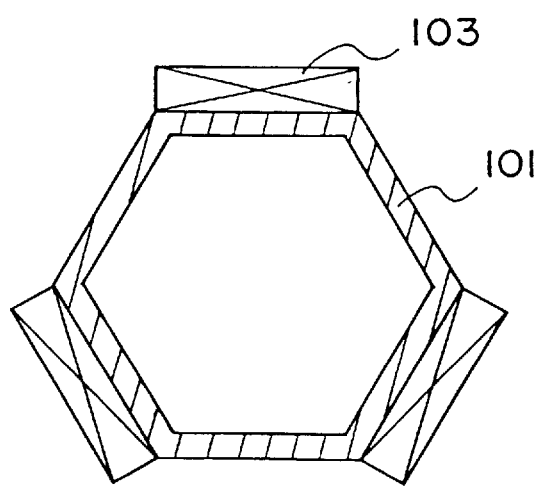
FIG. 10 is a transverse sectional view of a variation of the thermoelectric conversion element placement.

FIG. 10 shows a variation of the mode of joining the thermoelectric conversion element to the vessel (all elements other than the thermoelectric conversion elements and vessel are omitted from the drawing).

Thermoelectric conversion elements 103 are joined to three of the six flat sides on the exterior of hexagonal vessel 101, for example, placing them on every other side as shown in FIG. 10. Thus, the thermoelectric conversion elements 103 do not need to cover absolutely the entire external area of the vessel 101, provided they are placed so as to uniformly cool the fluid that flows through the vessel 103 (in other words, if the thermoelectric conversion elements 103 are placed over substantially the entire outer surface).

Figure 11:
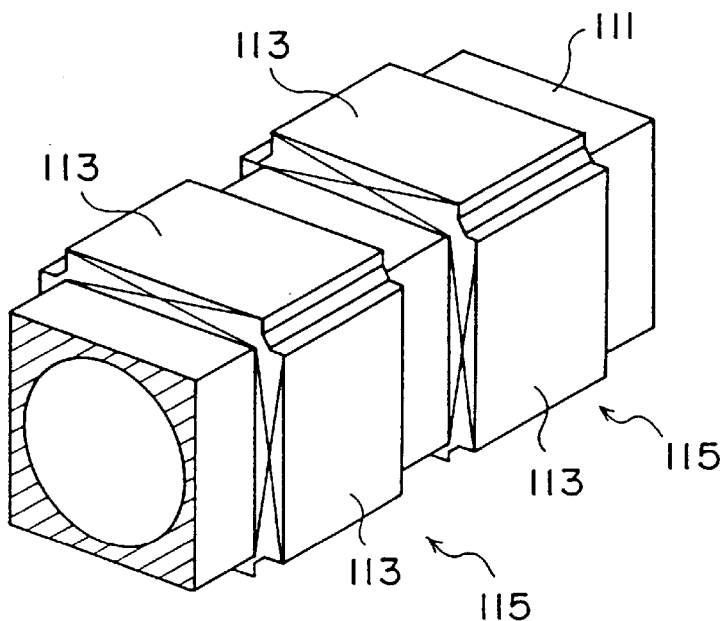
FIG. 11 is a perspective view of another variation of the thermoelectric conversion element placement.

FIG. 11 shows another variation of the mode of joining the thermoelectric conversion elements to a vessel.

FIG. 11 shows several thermoelectric conversion belts 115, each composed of four thermoelectric conversion elements 113 connected in a loop and fitted about a square cylindrical vessel 111, for example. The thermoelectric conversion belts 115 can be placed against each other or separated, as shown in the drawing, if satisfactory cooling effect can be obtained. The cooling pipes are not shown in the drawing, but can be extended parallel to the center axis of the vessel 111 or wound in a spiral around the outside of the vessel 111 so as to firmly contact the outside faces of the thermoelectric conversion belts 115. If a thermoelectric conversion element 113 fails, the thermoelectric conversion belt 115 can be replaced as a unit.

Figure 12:
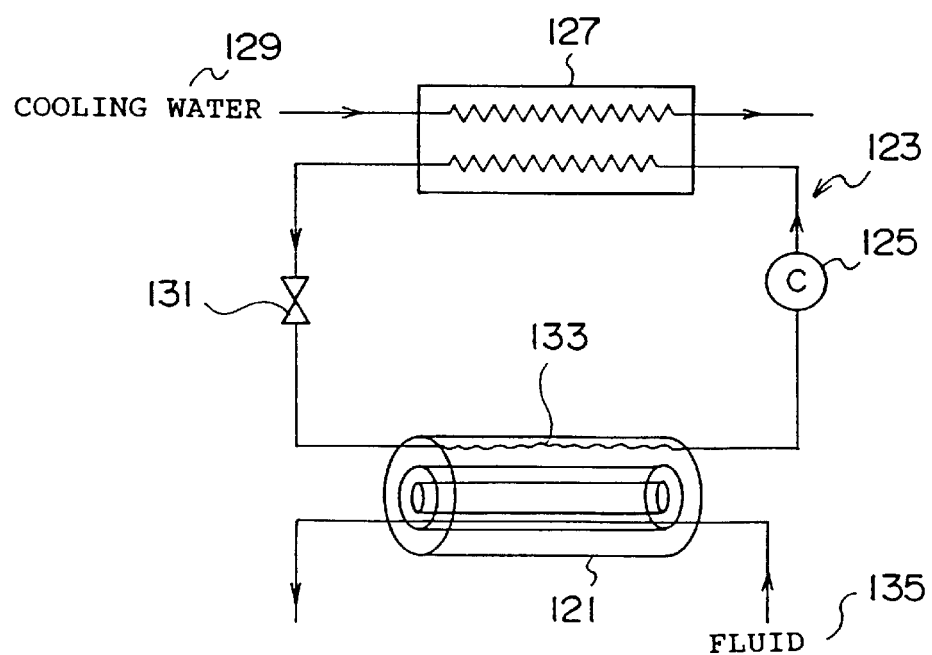
FIG. 12 is a circuit diagram of a variation of an arrangement for supplying cooling liquid to a fluid temperature control unit.

FIG. 12 shows a variation of an arrangement for supplying cooling liquid to the fluid temperature control device of the present invention.

A fluid temperature control device 121 of the present invention is connected to a refrigeration circuit 123 that uses a refrigerant, such as a CFC, as shown in FIG. 12. In the refrigeration circuit 123, the refrigerant is abiabatically compressed by a compressor 125 and is then cooled and condensed by cooling water 129 in a condenser 127; after then being brought to low pressure by an expansion valve 131, the refrigerant is sent to the cooling pipes 133 of the fluid temperature control device 121, which acts as an evaporator, and here a fluid 135 that flows through the fluid temperature control device 121 is cooled. This arrangement allows the fluid to be cooled to a lower temperature than when the cooling water is allowed to flow unmodified into the cooling pipes 133 of the fluid temperature control device 121. In other words, where cooling water (normally about 25° C.) flows into the cooling pipes 133 and the action of the thermoelectric conversion elements has cooled the fluid to about 0° C., for example, then the arrangement shown in FIG. 12 can cool the fluid to minus several tens of degrees Celsius through the action of the refrigeration circuit and of the thermoelectric conversion elements. FIG. 12 only shows one fluid temperature control device 121, but a plurality of fluid temperature control devices 121 can be connected to a single refrigeration circuit 123.

Figure 13:
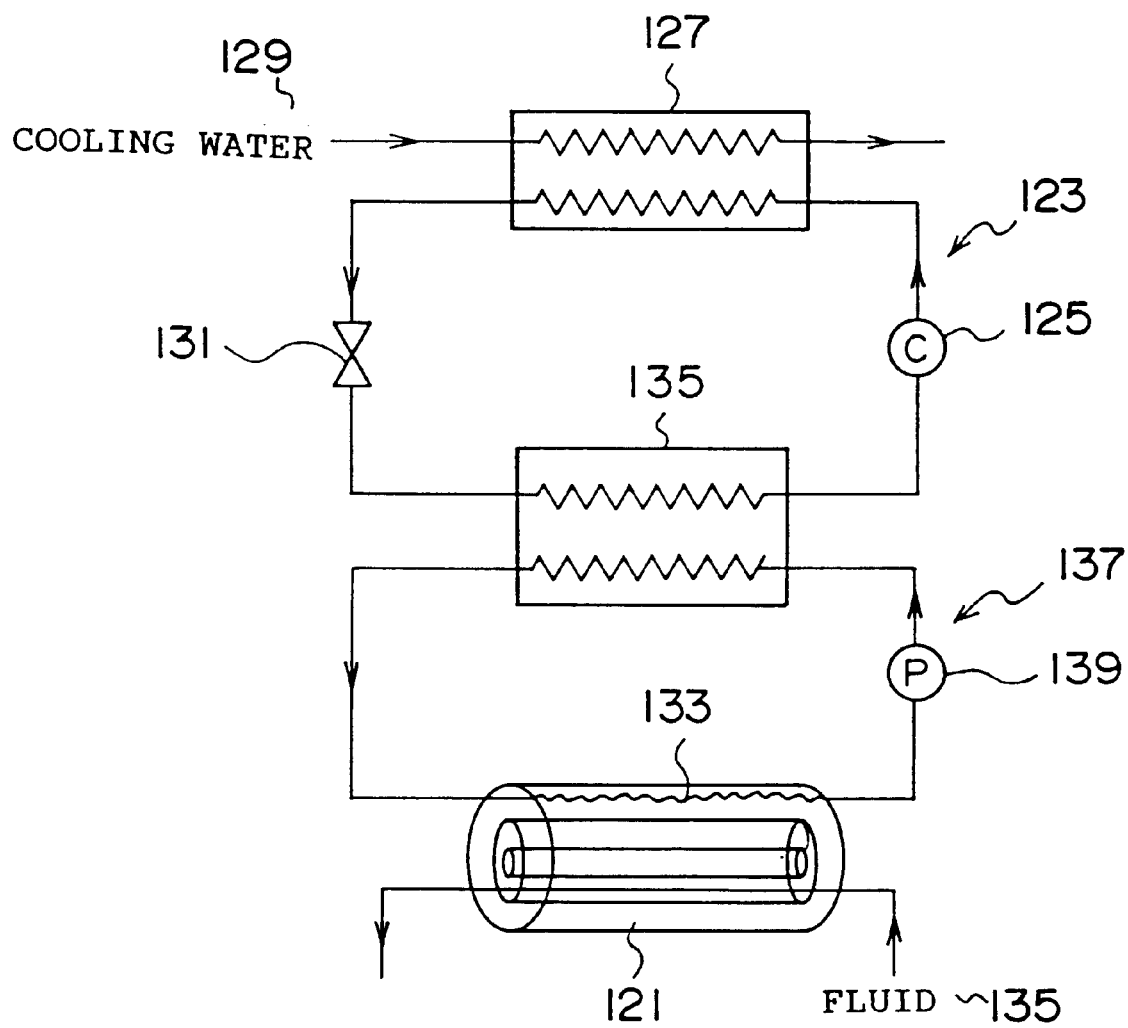
FIG. 13 is a circuit diagram of another variation of an arrangement for supplying cooling liquid to a fluid temperature control unit.

FIG. 13 shows another variation of an arrangement for supplying cooling liquid.

An anti-freeze circuit 137 is additionally provided between the same refrigeration circuit 123 and fluid temperature control device 121 that are shown in FIG. 12. The anti-freeze circuit 137 circulates anti-freeze between the evaporator 135 of the refrigeration circuit 123 and the cooling pipes 133 of the fluid temperature control device 121 using a pump 139. This arrangement achieves the same cooling capacity as the arrangement shown in FIG. 12, but because there is no need to extend a refrigeration pipe (the interior is in a near vacuum state) from the expansion valve 131 to inside the fluid temperature control device 121, the design of the fluid temperature control device 121 is simpler than that of the device shown in FIG. 12. FIG. 13 shows only one fluid temperature control device 121, but a plurality of fluid temperature control devices 121 can be connected to a single refrigeration circuit 137.

Figure 14:
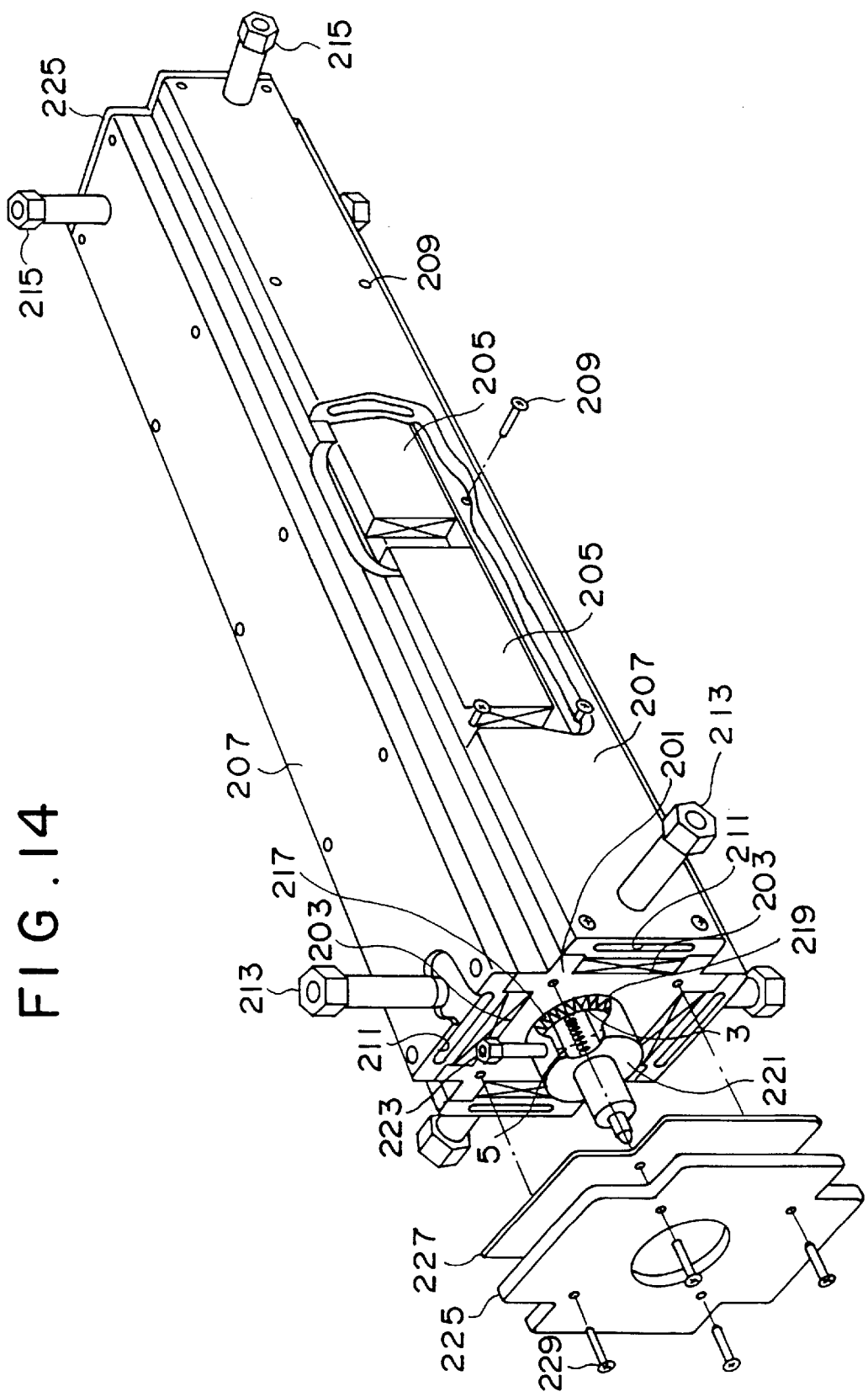
FIG. 14 is a partially exploded and cutaway perspective view of a fluid temperature control unit pertaining to a fifth embodiment of the present invention.

FIG. 14 shows a sixth embodiment.

The vessel 201 has an approximately square pillar shape, and on each of the four exterior faces of this pillar is formed a trough 203 that runs the length of the vessel 201. The cross-sectional shape of each trough 203 is rectangular, and in these troughs are embedded a large number of flat thermoelectric conversion elements 205 that are of a size to just fit into these troughs. Covering the troughs 203 from the outside are four long, narrow cooling plates 207 held in place over the four exterior sides of the vessel 201 by screws 209. Each cooling plate 207 has an interior cooling liquid passage 211 that runs the length of the cooling plate, and in each cooling liquid passage 211 are provided fins (omitted from the drawing), which are similar to those already explained in other embodiments. Further, the two lengthwise ends of each cooling plate 207 are respectively provided with a cooling liquid inlet pipe 213 that leads the cooling liquid to the passage 211 and a cooling liquid outlet pipe 215 that discharges the cooling liquid from the passage 211.

In the center of the vessel 201 is formed a round cylindrical hollow that runs the length of the vessel 201. In the round cylindrical hollow is inserted a set consisting of a heating lamp 5 and a transparent cylinder 3 that are the same as those already explained in other embodiments, thereby forming a fluid passage 217 between the outside surface of the transparent cylinder 3 and the inside surface of the hollow. In the fluid passage 217 are provided fins 219 joined to the inside surface of the hollow.

The central portion of each end of the vessel 201 is covered with a ring-shaped cap 221 so that each end of the fluid passage 217 is sealed. Both ends of lamp 5 pass through the ring-shaped caps 221 and extend to the outside. Further, the cap 221 closest to the cooling liquid inlet tube 213 is provided with a fluid outlet pipe 223 for discharging the fluid from the fluid passage 217, and the other cap, which is hidden by the vessel 201 and therefore, is not shown in the drawing, is provided with a fluid inlet pipe f or allowing fluid to enter the fluid passage 217. Therefore, the fluid in the fluid passage 217 flows in the opposite direction of the cooling liquid in the cooling liquid passage 211. Further, an approximately square end plate 225 that has a hole in the center for the cap 221 to pass through is secured, via a rubber packing 227 of the same shape interposed between it and the vessel 210, to each end of the vessel 201 by means of machine screws. Both ends of the cooling liquid passage 211 are covered by the end plates 225.

Figure 15:
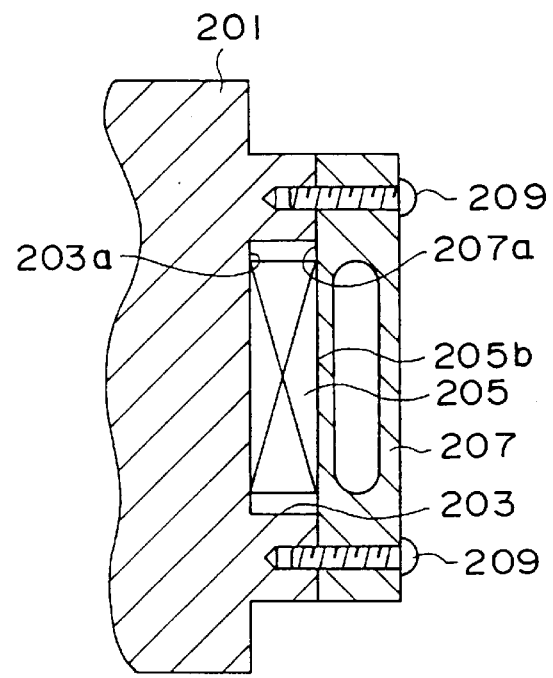
FIG. 15 is a transverse sectional view of a mounting area of a thermoelectric conversion element of a fifth embodiment of the present invention.

FIG. 15 shows a cross-section of the thermoelectric conversion element 205 mounting on the device shown in FIG. 14.

Figure 16:
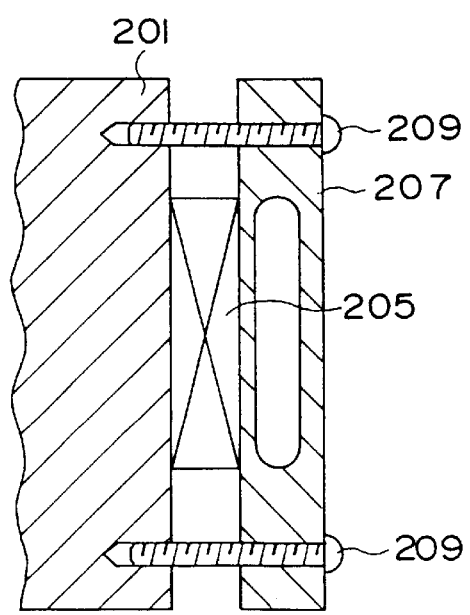
FIG. 16 is a transverse sectional view of a variation of a mounting structure for a thermoelectric conversion element.

As shown in the drawing, tightened screws 209 hold the front and back heat exchange faces 205a, 205b of the thermoelectric conversion element 205 securely against the bottom 203a of the trough 203 and the outside face 207a of the cooling plate 207, respectively (silicone grease, etc., is spread on the mated surfaces) to minimize heat resistance at the mated surfaces. In FIG. 15, there are shown gaps between the side faces of the thermoelectric conversion element 205 and the interior side faces of the trough 203, but the two elements can touch leaving no gap. It is also possible to not provide a trough in the vessel 201, but to simply sandwich the thermoelectric conversion unit 205 between the vessel 201 and the cooling plate 207 and secure it in place with screws 209, as shown in FIG. 16.

Figure 17:
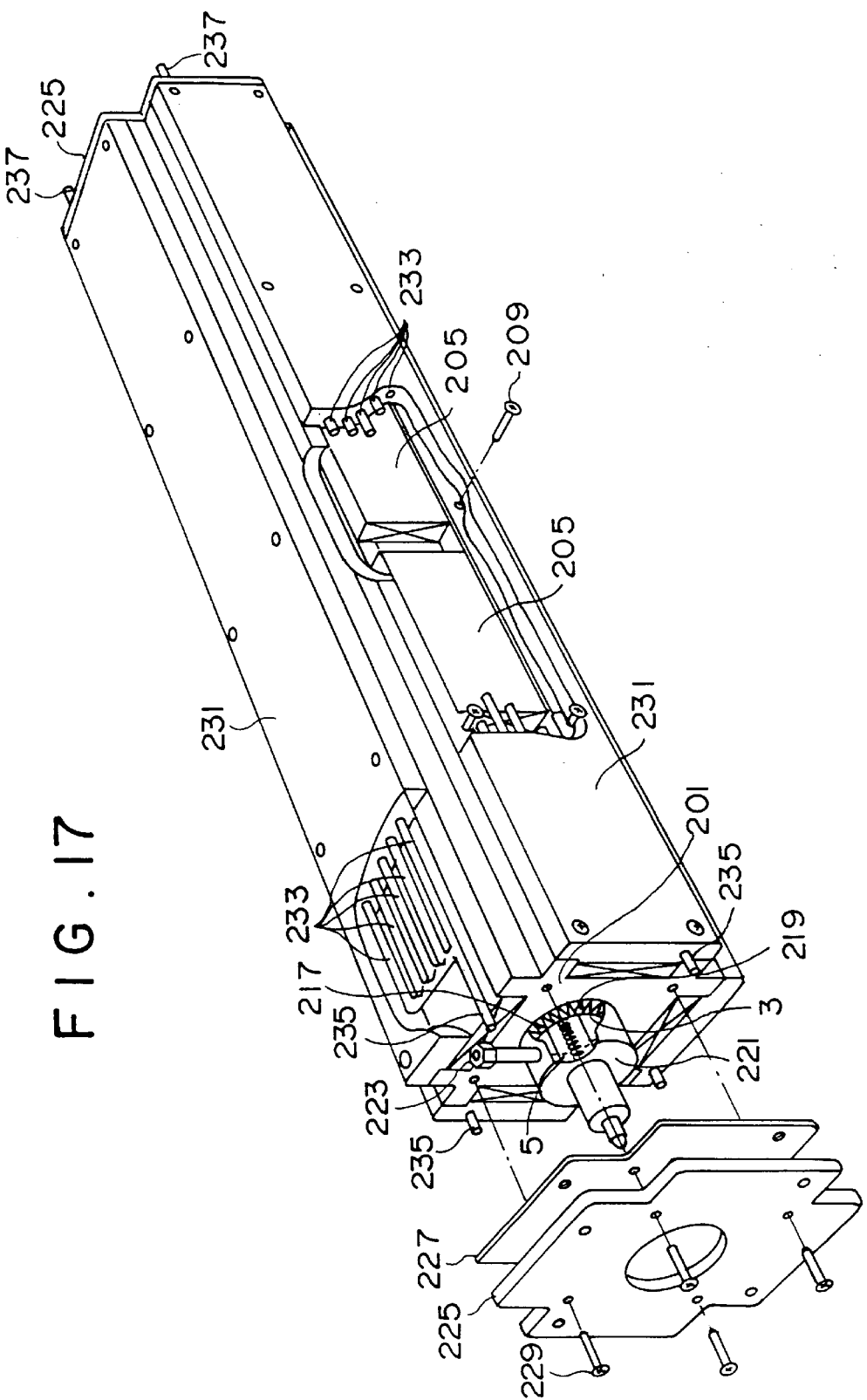
FIG. 17 is a partially exploded and cutaway perspective view a fluid temperature control unit pertaining to a sixth embodiment of the present invention.

FIG. 17 shows a seventh embodiment.

In this device the inside arrangement of the cooling plates of the device shown in FIG. 14 has been changed. In other words, on the inside of each cooling plate 231 are embedded a plurality of thin cooling liquid pipes 233 that run parallel to each other along the length of the cooling plate. The plurality of cooling liquid pipes 233 are connected to a single cooling liquid inlet pipe 235 on one end and to a single cooling liquid outlet pipe 237 on the other end. The cooling liquid inlet pipe 235 and cooling liquid outlet pipe 237 each extend from a side face of a cooling plate 231 and pass to the outside through the packing 227 and the end plate 225.

Figure 18:
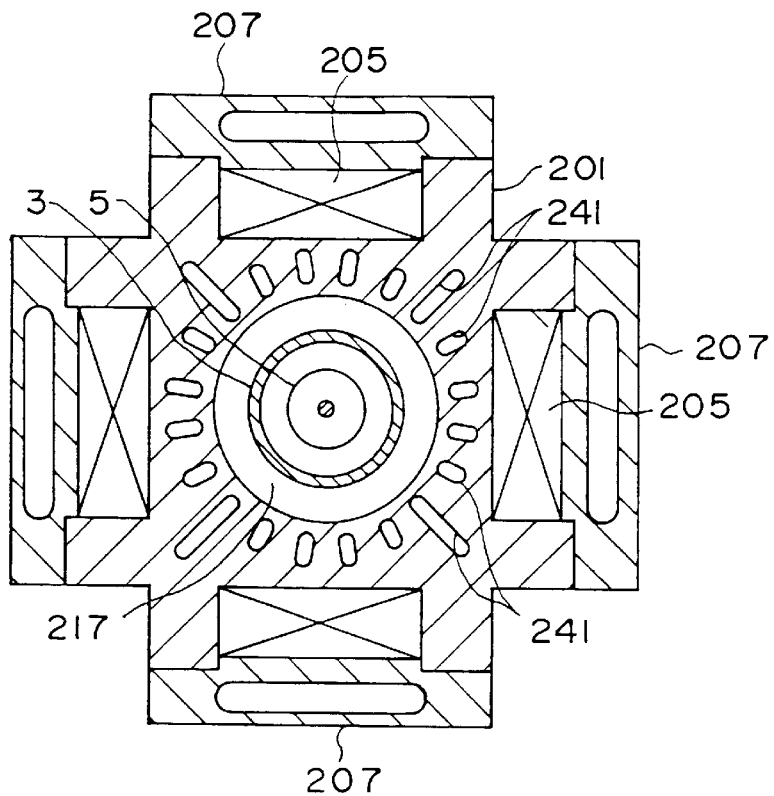
FIG. 18 is a longitudinal sectional view of a variation of a vessel pertaining to a fifth and sixth embodiment of the present invention.

FIG. 18 shows a variation of the cross-sectional construction of the vessel in the devices shown in FIGS. 14 and 17.

Figure 19:
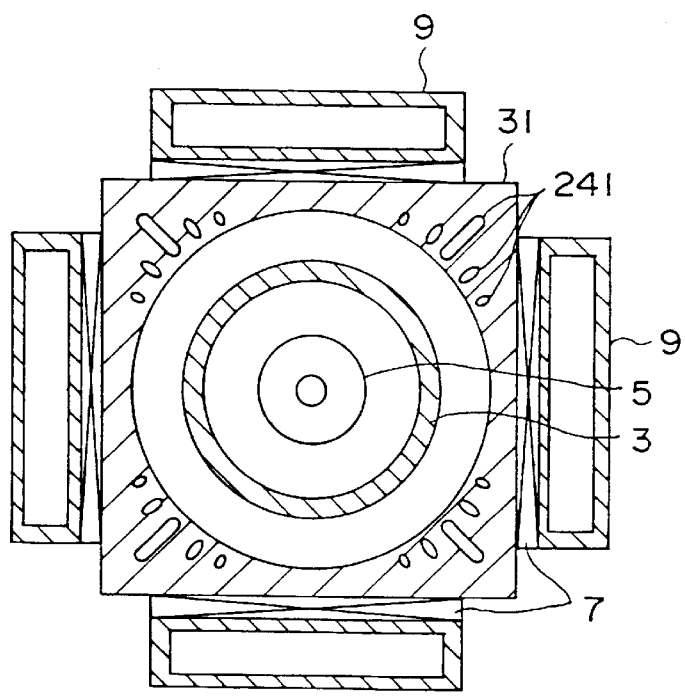
FIG. 19 is a longitudinal sectional view of a variation of a vessel pertaining to a second embodiment of the present invention.

The wall of the vessel 201 shown in FIGS. 14 and 17 is of considerable thickness, and in this case a large number of holes (or hollows) 241 can be provided in the 13 wall of the vessel 201, as shown in FIG. 18. It is desirable that holes 241 be formed so that portions of the vessel wall without holes 241 extend continuously from the interior to the exterior of the vessel (in other words, in the radial direction) to ensure good conduction of heat from the fluid passage 217 in the vessel to the thermoelectric conversion elements 205 situated on the exterior of the vessel. Using a length-wise extrusion molding method to manufacture the vessel 201 is a simple way to manufacture a vessel 201 having many holes 241 running its length. The presence of a large number of holes 241 reduces the volume of the vessel 201 to make it lighter and less expensive, and the accompanying reduction of the heat capacity of the vessel 201 gives the device good thermal responsiveness. Similar holes can also be formed in the vessel wall in the other embodiments. For example, the embodiment shown in FIG. 5 can also be made lighter in weight and given improved thermal responsiveness by forming holes 241 in the thick areas of the wall of vessel 31 as shown in FIG. 19.

The preceding description of the embodiments intended to facilitate an understanding of the present invention, and these embodiments are not intended to limit the scope of the present invention. The present invention encompasses a variety of other aspects, such as alterations, modifications, and improvements, to the above embodiments without deviating from the spirit thereof. For example, without deviating from the spirit of the present invention, the present invention can embody a fluid temperature control device the purpose of which is only to cool a fluid without having means for heating the fluid, or a fluid temperature control unit that does not use a cooling liquid.

What is claimed is:

1. A fluid temperature control device for controlling the temperature of a fluid, comprising:

a cylindrical vessel having an inside surface in which is formed a fluid passage in which flows said fluid, and having an outside surface with flat side portions;

a transparent cylinder that is inserted into said vessel and that forms said fluid passage between the inside surface of said vessel and outside surface of said transparent cylinder;

a lamp arranged within said transparent cylinder and utilized as a heater for emitting infrared light inside said fluid passage;

thermoelectric conversion elements having first and second faces that absorb heat and discharge heat, respectively, and being attached to said flat side portions of said outside surface via said first face; and a cooling liquid passage in which flows a cooling liquid and which is joined to said second face of said thermoelectric conversion elements.

2. The fluid temperature control device according to claim 1, wherein a plurality of said thermoelectric conversion elements are arranged over substantially the entire area of the outside surface of said vessel.

3. The fluid temperature control device according to claim 1, further comprising a large number of fins that are attached to the inside surface of said vessel and are placed in a dispersed manner within said fluid passage.

4. The fluid temperature control device according to claim 1, further comprising a large number of fins that are placed in a dispersed manner within said cooling liquid passage.

5. The fluid temperature control device according to claim 1, further comprising a refrigeration circuit that is connected to said cooling liquid passage and that has an expansion valve through which a refrigerant passes, the refrigerant discharged from said expansion valve being supplied as said cooling liquid to said cooling liquid passage.

6. The fluid temperature control device according to claim 1, comprising:

an anti-freeze circuit that is connected to said cooling liquid passage and that supplies anti-freeze as said cooling liquid to said cooling liquid circuit; and a refrigeration circuit that is connected to said anti-freeze circuit and that has an expansion valve through which passes a refrigerant, said anti-freeze being cooled using the refrigerant discharged from said expansion valve.

7. The fluid temperature control device according to claim 1, wherein said vessel has troughs on the outside surface thereof, said flat side portions being formed within these troughs, and said thermoelectric conversion elements being embedded within said troughs.

8. The fluid temperature control device according to claim 7, wherein said fluid passage within said vessel is formed with a round cylindrical shape.

9. The fluid temperature control device according to claim 1, wherein the wall of said vessel has holes or hollows.

10. The fluid temperature control device according to claim 1, wherein said vessel is formed as a polygonal cylinder, the outside surface thereof having a plurality of said flat side portions.

11. The fluid temperature control device according to claim 10, wherein said fluid passage within said vessel is formed with a round cylindrical shape.

12. The fluid temperature control device according to claim 1, wherein said fluid passage within said vessel is formed with a round cylindrical shape.

13. The fluid temperature control device according to claim 1, wherein said plurality of thermoelectric conversion elements are arranged in the axial direction of said vessel.

14. The fluid temperature control device according to claim 1, where said plurality of thermoelectric conversion elements are arranged in the circumferential direction of said vessel.

15. A fluid temperature control device for controlling the temperature of a fluid, comprising:

a cylindrical vessel having an outside surface and an inside surface in which is formed a fluid passage in which flows said fluid;

thermoelectric conversion elements having first and second faces that absorb heat and discharge heat, respectively, and being attached to said outside surface via said first face;

a cooling liquid passage in which flows a cooling liquid, joined to said second face of said thermoelectric conversion elements;

a transparent cylinder which is inserted into said vessel and which forms said fluid passage between the inside surface of said vessel and an outside surface of said transparent cylinder; and a lamp arranged within said transparent cylinder and utilized as a heater for emitting infrared light inside said fluid passage.

16. The fluid temperature control device according to claim 15, wherein a plurality of said thermoelectric conversion elements are arranged over substantially the entire area of the outside surface of said vessel.

17. The fluid temperature control device according to claim 15, further comprising a large number of fins that are attached to the inside surface of said vessel and are placed in a dispersed manner within said fluid passage.

18. The fluid temperature control device according to claim 15, further comprising a large number of fins that are placed in a dispersed manner within said cooling liquid passage.

19. The fluid temperature control device according to claim 15, further comprising a refrigeration circuit that is connected to said cooling liquid passage and that has an expansion valve through which a refrigerant passes, the refrigerant discharged from said expansion valve being supplied as said cooling liquid to said cooling liquid passage.

20. The fluid temperature control device according to claim 15, comprising:

an anti-freeze circuit that is connected to said cooling liquid passage and that supplies anti-freeze as said cooling liquid to said cooling liquid circuit; and a refrigeration circuit that is connected to said anti-freeze circuit and that has an expansion valve through which passes a refrigerant, said anti-freeze being cooled using the refrigerant discharged from said expansion valve.

21. The fluid temperature control device according to claim 15, wherein the wall of said vessel has holes or hollows.

22. The fluid temperature control device according to claim 15, wherein said fluid passage within said vessel is formed with a round cylindrical shape.

* * * * *